United States Patent
Yen et al.

(10) Patent No.: US 11,194,886 B2
(45) Date of Patent: Dec. 7, 2021

(54) BIT-ORDERED BINARY-WEIGHTED MULTIPLIER-ACCUMULATOR

(71) Applicant: Applied Materials, Inc., Santa Clara, CA (US)

(72) Inventors: She-Hwa Yen, Mountain View, CA (US); Frank Tzen-Wen Guo, Danville, CA (US)

(73) Assignee: Applied Materials, Inc., Santa Clara, CA (US)

( * ) Notice: Subject to any disclaimer, the term of this patent is extended or adjusted under 35 U.S.C. 154(b) by 217 days.

(21) Appl. No.: 16/408,059

(22) Filed: May 9, 2019

(65) Prior Publication Data

US 2020/0356620 A1    Nov. 12, 2020

(51) Int. Cl.
  *G06F 17/16*    (2006.01)
  *H03M 1/74*    (2006.01)
  *G06F 7/544*   (2006.01)

(52) U.S. Cl.
  CPC ............ *G06F 17/16* (2013.01); *G06F 7/5443* (2013.01); *H03M 1/74* (2013.01)

(58) Field of Classification Search
  CPC ......... G06F 17/16; G06F 7/5443; H03M 1/74
  See application file for complete search history.

(56) References Cited

U.S. PATENT DOCUMENTS

| | | | |
|---|---|---|---|
| 10,235,343 B2 | 3/2019 | Dourbal | |
| 2004/0243657 A1* | 12/2004 | Goren | G06T 1/0007 708/607 |
| 2017/0228345 A1 | 8/2017 | Gupta et al. | |
| 2019/0065151 A1 | 2/2019 | Chen et al. | |
| 2019/0080230 A1 | 3/2019 | Hatcher et al. | |

OTHER PUBLICATIONS

International Search Report and Written Opinion dated Aug. 6, 2020 in International Patent Application No. PCT/US2020/029326, 9 pages.

Lee, E.H., et al., "Analysis and Design of a Passive Switched-Capacitor Matrix Multiplier for Approximate Computing", arXiv:1612.00933v1, Dec. 3, 2016, pp. 1-34 [retrieved on Sep. 3, 2020], Retrieved from https://arxiv.org/abs/1612.00933.pdf.

* cited by examiner

*Primary Examiner* — Michael D. Yaary (74) *Attorney, Agent, or Firm* — Kilpatrick Townsend & Stockton LLP (57) ABSTRACT

Various arrangements for performing vector-matrix multiplication are provided here. Digital input vectors that include binary-encoded values can be converted into a plurality of analog signals using a plurality of one-bit digital to analog converters (DACs). Using an analog vector matrix multiplier, a vector-matrix multiplication operation can be performed using a weighting matrix for each bit-order of the plurality of analog signals. For each performed vector-matrix multiplication operation, a bit-ordered indication of an output of the analog vector matrix multiplier may be stored. A bit-order weighted summation of the sequentially performed vector-matrix multiplication operation may be performed.

20 Claims, 4 Drawing Sheets

BIT-ORDERED BINARY-WEIGHTED MULTIPLIER-ACCUMULATOR

BACKGROUND

A vector-matrix multiplication operation can be defined as the sum of a product of a vector and a matrix. Specifically, Equation 1 can be used to define a vector-matrix multiplication operation in which the product is summed.

$$Y = \Sigma_i W_{ij} X_i \qquad \text{Eq. 1}$$

In Equation 1, $X_i$ is an input vector composed of values (which can be represented in an electronic environment using binary bits) and $W_{ij}$ represents matrix weighting values. Y is the output vector obtained by summing the product vector. This function has applications in various signal processing, image processing, and artificial intelligence applications, such as in the use of neural-networks.

Performing this equation, when performed digitally, can consume a significant amount of processing resources and/or energy. Conventional analog componentry or digital and analog hybrid componentry can require a relatively large number of clock cycles, and/or a relatively large area of space to implement.

SUMMARY

Various arrangements for performing vector-matrix multiplication are provided herein. A digital input vector comprising binary-encoded values can be converted into a plurality of analog signals using a plurality of one-bit digital to analog converters (DACs). Using an analog vector matrix multiplier, a vector-matrix multiplication operation may be performed using a weighting matrix for each bit-order of the plurality of analog signals. For each performed vector-matrix multiplication operation, a bit-ordered indication of an output of the analog vector matrix multiplier may be stored. A bit-order weighted summation of the sequentially performed vector-matrix multiplication operation for each bit-order may be performed.

Such arrangements may include one or more of the following features: A number of clock cycles to perform the vector-matrix multiplication operation using the weighting matrix for each-bit-order can be equal to a number of bit-orders of the binary-encoded values of the input vector. The bit-ordered weighted summation can be performed using an analog circuit. The bit-ordered weighted summation can be performed based on an amount of charge stored by the summation circuit. The bit-ordered weighted summation can be performed in a single clock cycle. The bit-ordered weighted summation can be based on an accumulated total charge stored by the summation circuit. A voltage may be output, wherein the magnitude of the voltage is indicative of a summation value.

BRIEF DESCRIPTION OF THE DRAWINGS

A further understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Embodiments detailed herein allow for multiplier accumulator (MAC) operations to be performed during a shorter amount of time (e.g., fewer clock cycles) compared to conventional analog embodiments and do not require digital input signals to be decoded. Rather, input vectors in the form of binary encoded (or "bit-ordered") values can be received. Such values are typically arranged from LSB to MSB or MSB to LSB (e.g., "1110", representing a value of 14) and can be multiplied in the analog domain then summed in the analog or digital domain. Arrangements detailed herein are performed directly on analog conversions of binary encoded values and do not require the input vectors to be converted to a series of pulses (e.g., fourteen pulses to represent a value of 14). This, computation can be performed significantly quicker than conventional analog arrangements. More specifically, the number of operation cycles to perform vector-matrix multiplication can be reduced by $$\frac{2^{Nbit}}{Nbit + 2}$$

times. In this equation, the additional 2 cycles indicated in the denominator can vary by implementation. For example, embodiments detailed herein can perform vector-matrix multiplication for 8-bit input vectors that may be sped up 25.6 times as compared to conventional analog MAC designs.

Further, the arrangements detailed herein may have significant space savings over conventional analog MAC designs. By using one bit digital-to-analog converters (DACs), less area may be needed than if multi-bit DACs that convert a binary value received in parallel are used. Specifically, multiple one bit DACs may be used to convert binary-encoded input vectors to binary-encoded analog voltage values in parallel. For instance, for four bit input vectors, four clock cycles may be needed to output the binary-encoded analog voltage value from the one-bit DAC (one cycle for LSB, one cycle for second LSB, one cycle for second MSB, one cycle for MSB). The number of one-bit DACs may be dependent on the number of input vectors ($X_i$ in Equation 1).

Matrix multiplication operations may be performed sequentially for each bit-order of the input vector's values at a time. The parallel output of each one-bit DAC may be input to weighting components of a vector matrix multiplier circuit. The vector matrix multiplier circuit may have various weighting components that correspond to the $W_{ij}$ matrix of Equation 1 with which $X_i$ is being multiplied. The vector matrix multiplier circuit may perform multiplication operations for each bit-order of the input vectors. Therefore, if the input vector contains values four bits in length, the vector matrix multiplier circuit may perform multiplication operations for each of the four bit-orders sequentially in the time domain. The output from the vector matrix multiplier circuit may be sequential signals (e.g., that have a current or some of electrical characteristic indicative of a multiplication result) that are output to a summation circuit.

The summation circuit may function to perform a bit-order weighted summation after the matrix multiplication operations have been performed. The summation circuit may function in either the analog or digital domain. The summation circuit may receive signals from the vector matrix multiplication circuit, store indications of each matrix multiplication operation in such a way that it is weighted for the proper bit-order, and perform a summation to determine the output value Y.

Figure 1:
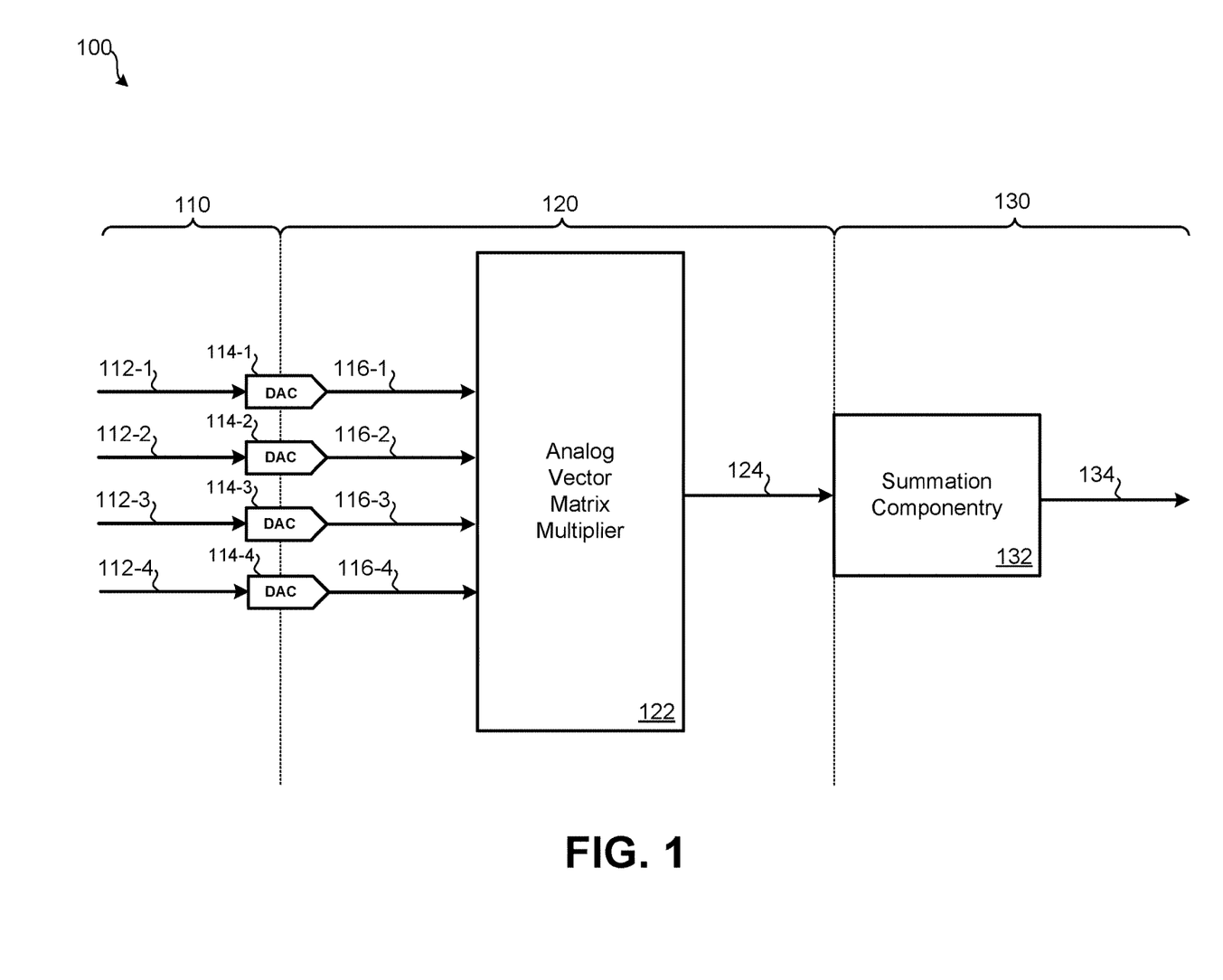
FIG. 1 illustrates an embodiment of a vector-matrix multiplier circuit in which vector multiplication is performed using analog components to bit-ordered binary values.

FIG. 1 illustrates an embodiment of a circuit 100 in which vector multiplication is performed using analog components on binary-encoded inputs. Circuit 100 can include: one-bit DACs 114; analog vector matrix multiplier 122; and summation componentry 132. Circuit 100 can be understood as divided into three sections. Section 110 receives binary-encoded digital signals (which represent an input vector) and converts the binary-encoded digital signals to binary-encoded analog signals. Section 120 receives binary-encoded analog signals and outputs binary-encoded products indicative of multiplication between the binary-encoded analog signals and a pre-defined matrix (e.g., a weighting matrix). Section 130 performs a bit-order weighted summation to sum the binary-encoded products and take into account the bit-order weighting of the binary-encoded signals. Therefore, the proper bit-orders of each bit of the binary-encoded input signals is maintained such that the summation can be determined properly. Section 130 may use analog componentry to efficiently sum the product outputs of section 120. Section 130 may also function in the digital domain.

Specifically, in section 110, multiple digital input signals 112 may be received in parallel. Digital input signals 112 represent binary-encoded values and each digital input signal of digital input signals 112 can represent a value of the vector $X_i$ of Equation 1. The binary bits of input signals 112 may be represented by voltage levels (e.g., high for one, low for zero), pulses (e.g., a pulse for one, no pulse for zero) or time (e.g., a pulse of a first duration for one, a pulse of a second duration for zero). As illustrated, four digital input signals (112-1, 112-2, 112-3, and 112-4) are received in parallel. Each of these input signals receives a separate value of the input vector. In other embodiments, fewer or greater numbers of digital input signals may be received. Each of digital input signals 112 may be binary-encoded. Therefore, for each clock-cycle of the digital portion of the circuit, a bit for a particular bit-order is received as digital input signals 112. For example, if a four bit binary value is being input via each digital input signal, four clock cycles may be needed for the binary values to be received and converted to the analog domain in parallel. The digital input signals 112 may be binary-encoded such that each value's bit-order is from least significant bit (LSB) to most significant bit (MSB), from MSB to LSB, or in an arbitrary, pre-defined pattern.

Digital input signals 112 can be input to one-bit DACs 114. Again here, as illustrated, four one-bit DACs 114 (114-1, 114-2, 114-3, and 114-4) are present. In other embodiments, fewer or greater numbers of one-bit DACs 114 may be present. A single one-bit DAC may be present for each binary-encoded digital input signal 112. Each of the one-bit DACs 114 may output an analog signal indicative of the digital value received. Therefore, binary-encoded analog signals 116 (116-1, 116-2, 116-3, 116-4) can represent analog translations of the digital input signals 112.

In section 120, analog vector matrix multiplier 122 receives binary-encoded analog signals 116. Analog vector matrix multiplier 122 sequentially performs multiplication operations on each bit-order of the input values (e.g., a first clock cycle for the LSBs, a second clock cycle for the second LSBs, a third clock cycle for the second MSB, etc.). Therefore, a separate multiplication operation is performed for each bit-order of the received binary-encoded analog signals 116. Further detail regarding a possible embodiment of analog vector matrix multiplier 122 is provided in relation to FIG. 2. Binary-encoded multiplication results signal 124 may be output to summation componentry 132.

Summation componentry 132 can be understood as performing bit-order weighted summation functionality. Summation componentry 132 properly takes into account the bit-order of the bits currently being evaluated by analog vector matrix multiplier 122, stores the outputs such that the bit-order is taken into account, and performs a summation function. As detailed herein, bit-order weighting is performed by summation componentry 132 thus allowing the input values to remain binary-encoded when evaluated by the vector matrix multiplication circuit.

In a possible analog embodiment of summation circuitry, charge accumulation and redistribution can be used to perform a passive bit-order weighted summation. As binary-encoded signals are received from analog vector matrix multiplier 122, summation componentry 132 may use charge accumulation to accumulate partial summations. Once all bit-orders (e.g., four bit-orders for an input vector having four bit values) have been multiplied by analog vector matrix multiplier 122, and summation componentry 132 has stored partial summations such as using charge accumulation, the charge may be redistributed and a voltage representative of a final summation value may be output. Further detail regarding a possible embodiment of an analog implementation of summation componentry 132 is presented in FIG. 3.

Figure 2:
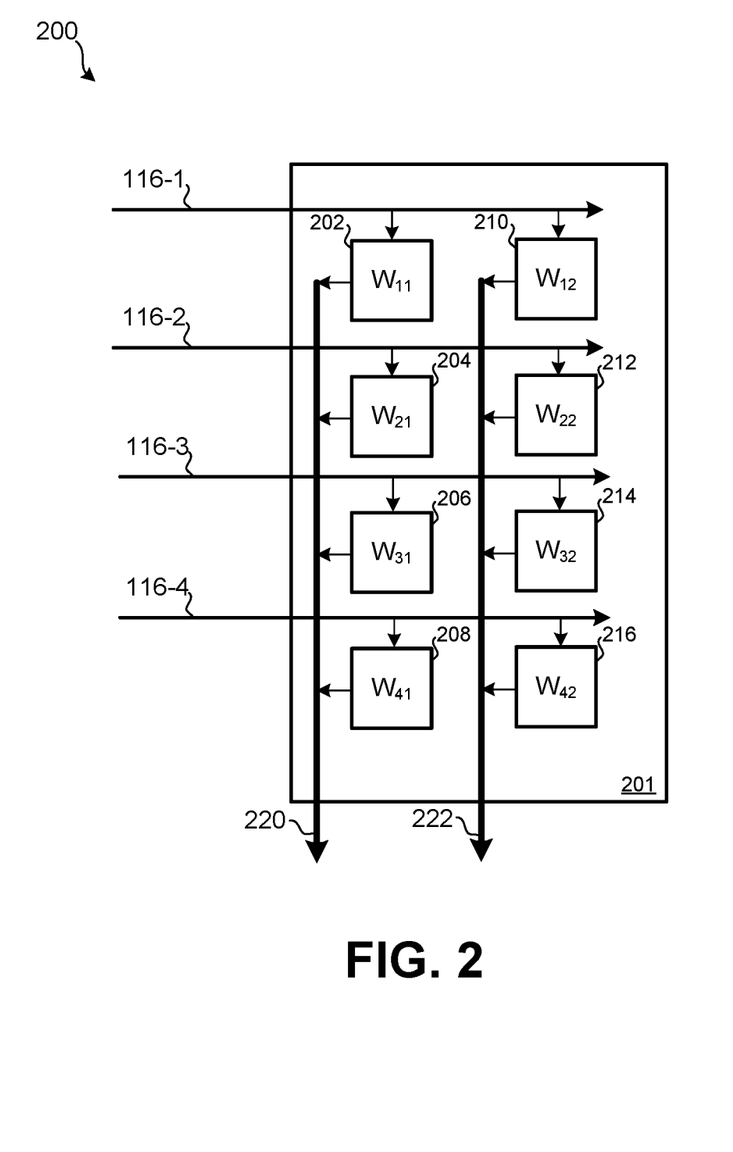
FIG. 2 illustrates an embodiment of an analog vector matrix multiplier.

FIG. 2 illustrates an embodiment 200 of an analog vector matrix multiplier that evaluates a single bit-order of an input vector that has been converted to analog. Analog vector matrix multiplier 201 can represent an embodiment of analog vector matrix multiplier 122 of FIG. 1. However, it should be understood that embodiment 200 is only an example. In FIG. 2, the binary vector input $X_i$ is to be multiplied with $W_{ij}$. Analog vector matrix multiplier 201 may include multiple weighting elements (202, 204, 206, 208, 210, 212, 214, and 216). Each weighting element may receive a binary-encoded analog signal of binary-encoded analog signals 116 from a one-bit DAC. In this example, the weighting element may output a current based on the voltage of its received binary-encoded analog signal and a weighting value of the particular weighting element. For instance, each weighting element may be implemented using various conductances. By varying the conductances of the weighting components, the amount of current output depending on the input voltage can be varied. For instance, if the voltage is 1 V, and the conductance of a weighting block is 8 μS, an output of 8 μA may be obtained. This value may further be weighted based on the bit-order of the value. Therefore, for the least significant bit, the multiplier would be 1, for the second LSB, the multiplier would be 2, and so on. In some embodiments, the weightings used by each weighting element are predetermined and fixed at manufacture. In other embodiments, the weighting of each weighting element may be configurable after manufacture and reconfigurable during use of embodiment 200.

The output of each weighting element (202, 204, 206, 208, 210, 212, 214, and 216) can be an electrical characteristic, such as current. The currents output from weighting elements connected to a same current output may be summed together. Therefore, current output 220 may include the sums of the current output by weighting elements 202, 204, 206, and 208; and current output 222 may include the sums of the current output by weighting elements 210, 212, 214, and 216.

A single bit of each value of the input vector is evaluated at a time (and bit-order is not taken into account by analog vector matrix multiplier 201). For example, for an input vector having four four-bit values, the MSB of each value may be evaluated first, followed by the second MSB of each value, followed by the second LSB, and finally followed by the LSB of each value (thus corresponding to four clock cycles of binary-encoded data output by the one-bit DACs). In other embodiments, evaluation may proceed from LSB to MSB or in a predefined, arbitrary order. (As detailed later in this document, the output of analog vector matrix multiplier 201 is weighted by the summation circuitry to take into account the bit-order of the bits to which the multiplication operation is being performed by the vector matrix multiplier.

The number of columns of weighting elements is arbitrary and can be based on the weighting matrix with which the input vector is being multiplied. Therefore, while two columns are present in embodiment 200, fewer or a greater number of columns may be present in other elements. The number of rows of weighting elements may correspond to the number of values present in the input vector. For example, equation 2 can represent the current output by analog vector matrix multiplier 201:

$$I_{out_i} = \Sigma_{j=1}^{4} v_j * w_{ji}, i = 1 \ldots n \qquad \text{Eq. 2}$$

Continuing with the example, Current outputs (e.g., current outputs 220, 222) may be connected together to create a binary-encoded multiplication result signal 124. Summation componentry 132 properly weights, stores, then sums each bit-order to obtain a correct final summation.

Figure 3:
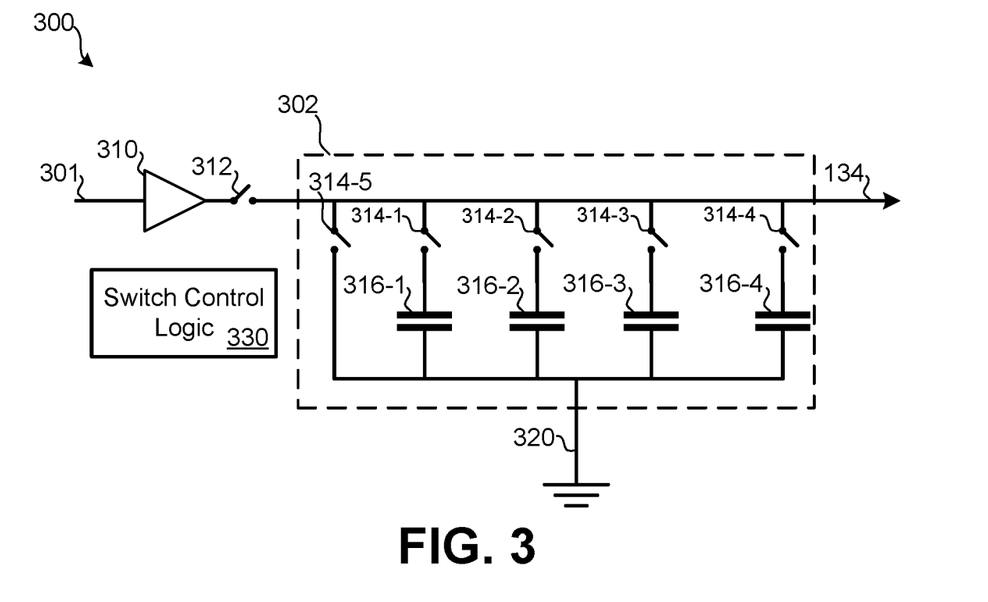
FIG. 3 illustrates an embodiment of an analog summation circuit.

FIG. 3 illustrates an embodiment 300 of an analog summation circuit. It should be understood that various different types of circuits may be used to accumulate and redistribute signals that may be in the form of voltage, current, charge or some other electrical characteristic. A key aspect of the analog summation circuit is that it applied the proper bit-weighting to received outputs of the analog vector matrix multiplier 201. For example, when an output corresponding to the second LSB of the input vector is output by the analog vector matrix multiplier 201, analog summation circuit applies a bit-weighting that is double that of the LSB and half of the third LSB. Embodiment 300 can represent summation componentry 132 of FIG. 1. Input 301 represents the binary-encoded multiplication result signal 124 from the analog vector matrix multiplier. Input 301 feeds to sense amplifier 310. Sense amplifier 310 outputs a voltage based on the current received on input 301 by sense amplifier 310. Specifically, embodiment 300 can use passive charge sharing and redistribution. Such an arrangement can help decrease power consumption and decrease the effect of thermal noise on the output value.

Embodiment 300 comprises a capacitor-switch array 302. The capacitors can be bit-order weighted, meaning that each capacitor's capacitance may be selected to passively store an amount of charge that is weighted for a particular bit-order.

As an example, to output a four-bit value, four capacitors are present. Capacitor 316-1 may be used to store charge corresponding to the LSB. Therefore, capacitor 316-1 can have a capacitance of C (where C is the unit value). Capacitor 316-2 may be used to store charge corresponding to the second LSB. Therefore, capacitor 316-2 can have a capacitance of 2C (which represents double the weight as C, thus corresponding to the second LSB in a binary bit-order). Capacitor 316-3 may be used to store charge corresponding to the second MSB. Therefore, capacitor 316-3 can have a capacitance of 4C. Capacitor 316-4 may be used to store charge corresponding to the MSB. Therefore, capacitor 316-4 can have a capacitance of 8C. Each capacitor has a capacitance corresponding to the bit-order for which it will be used to store charge indicative of the output of the analog vector matrix multiplier. The capacitance can be calculated according to Equation 3, where C is the unit value and N is the number of bits in the values of the input vector.

$$\text{Capacitance} = 2^{N-1}C \qquad \text{Eq. 3}$$

Switch control logic 330, which can be digital and connected with the same clock as section 110, can control whether switches 312, 314-1, 314-2, 314-3, 314-4, and 314-5 are open or closed. For simplicity, in FIG. 3, communication between switch control logic 330 and switches 312 and 314 are not illustrated. Switch control logic 330 may be dedicated logic circuitry or may be incorporated as part of a processing system. Switch control logic 330 may initially close switches 314-1, 314-2, 314-3, 314-4, and 314-5, while switch 312 is open. Switch 314-5 may function as a reset, causing charge present in capacitors 316-1, 316-2, 316-3, and 316-4 to discharge to ground 320.

Switch control logic 330 may then control the switches such that the capacitor having the capacitance associated with the current bit-order being evaluated by analog vector matrix multiplier 122 is connected to binary-encoded multiplication result signal 124. Switch control logic 330 may close switch 312 and open switches 314-2, 314-3, 314-4, and 314-5. Therefore, only switch 314-1 may remain closed, thus connecting capacitor 316-1 to an output of sense amplifier 310. During this clock cycle, analog vector matrix multiplier 122 may be outputting a binary-encoded multiplication results signal corresponding to the LSB. For the next clock cycle, switch control logic 330 may keep switch 312 closed, open switch 314-1, and close switch 314-2. During this clock cycle, analog vector matrix multiplier 122 may output a binary-encoded multiplication results signal corresponding to the second LSB. By virtue of capacitor 316-2 having double the capacitance of capacitor 316-1, the proper bit weighting is passively applied in the amount of charge stored. For the next clock cycle, switch control logic 330 may keep switch 312 closed, open switch 314-2, and close switch 314-3. During this clock cycle, analog vector matrix multiplier 122 may output a binary-encoded multiplication results signal corresponding to the second MSB. By virtue of capacitor 316-3 having double the capacitance of capacitor 316-2, the proper bit weighting is passively applied in the amount of charge stored. For the next clock cycle, switch control logic 330 may keep switch 312 closed, open switch 314-3, and close switch 314-4. During this clock cycle, analog vector matrix multiplier 122 may output a binary-encoded multiplication results signal corresponding to the MSB. By virtue of capacitor 316-4 having double the capacitance of capacitor 316-3, the proper bit weighting is passively applied by the amount of charge stored. At this stage, switched capacitor-switch array 302 stores the binary-encoded multiplication results separately as charge in the bit-order weighted capacitors.

At this point, each of capacitors 316-1, 216-2, 316-3, and 316-4 stores an amount of charge (Q) corresponding to the capacitors' particular bit-order. The amount of charge stored on a particular capacitor, for a given bit-order N, can be defined by Equation 4.

$$Q = 2^{N-1} * C * V \qquad \text{Eq. 4}$$

Therefore, the amount of charge is equal to a capacitor's capacitance multiplied by the voltage output by sense amplifier 310. As detailed in relation to Equation 3, the capacitance is increased by a factor of $2^{N-1}$ for each greater bit-order.

During a next clock cycle, switch control logic 330 may open switch 312, keep switch 314-5 open, and close switches 314-1, 314-2, 314-3, and 314-4. This step may be understood as a charge redistribution step. Since each capacitor stores an amount of charge corresponding to its bit-order, during the charge redistribution stage, the charge in each individual capacitor is distributed among capacitors 316-1, 316-2, 316-2, and 316-3 and is indicative of the final summation. Once redistribution has occurred, the summation is represented as a voltage value at the top plates of capacitors 316, which is output via summation output 134. Equation 5 represents the voltage value that will be output via summation output 134 based on the charge stored in each capacitor:

$$V_{Out} = \frac{Q_1 + Q_2 + Q_3 + \dots Q_N}{(2^N - 1) * C} \qquad \text{Eq. 5}$$

In Equation 5, the charge of each capacitor contributes an appropriate weighted amount based on the capacitor's associated bit-order to $V_{Out}$ as summation output 134, which represents the final weighted sum of the analog vector-matrix multiplication.

In total, for when the input vector includes four-bit values, the summation process may take six clock cycles until a valid summation output 134 is output. Stated more generally, the summation process can requires a reset clock cycle, a redistribution clock cycle, and a clock cycle for each bit of the value.

Figure 4:
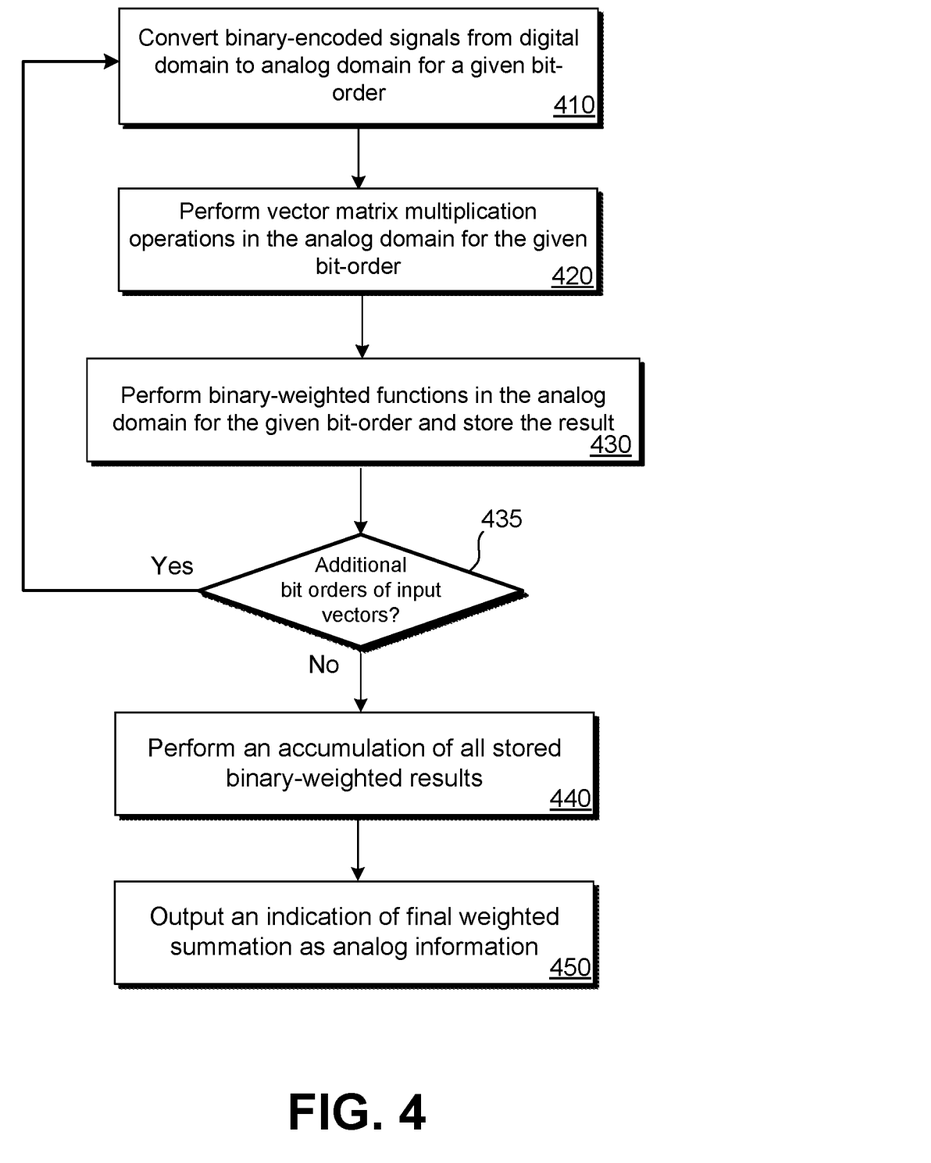
FIG. 4 illustrates an embodiment of a method for performing a vector-matrix multiplication operation.

While FIG. 4 illustrates four capacitors, it should be understood that this embodiment is for example purposes only. The number of capacitors may be increased or decreased to accommodate a different number of bits for values of the input vector. In an alternate embodiment, differential summation circuitry may be implemented such that common mode interference can be canceled out from summation output 134. Further, other embodiments may use alternate passive analog components to store and sum charge to determine summation output 134. In still other embodiments, summation circuitry may be implemented using digital circuitry.

Various methods may be performed using the systems and circuits detailed in FIGS. 1-3. FIG. 4 illustrates an embodiment of a method 400 for performing a vector-matrix multiplication operation. Method 400 may be performed using the circuits of FIGS. 1-3 or with alternate versions of such circuits. That is, it should be understood that the specific examples of circuits, such as those in FIGS. 2 and 3, are examples of how the circuit of FIG. 1 and the method of FIG. 4 can be implemented. In some embodiments, a digital summation circuit may be used.

At block 410, a bit-order of binary-encoded signals may be converted to binary-encoded analog signals. To perform this function, multiple one-bit DACs may be used in parallel. Therefore, each DAC may convert a digital signal to an analog signal for a given bit-order in parallel. Each DAC may receive a binary-encoded digital signal that is indicative of a particular bit-order for an input vector. Each vector may have N bits. Therefore, for the one-bit DACs to convert the binary-encoded digital signals to analog signals may take N clock cycles. For example, if the binary-encoded digital signal is "10011," it may take five clock cycles for this binary-encoded value (which represents a value of 19 assuming the right-most digit is the LSB) to be output by a one-bit DAC. The analog voltage output by each one-bit DAC may be dependent on a power voltage provided to each one-bit DAC.

At block 420, vector matrix multiplication is performed sequentially for the bit-order of the received binary-encoded analog signals. Block 420 may be performed for the particular bit-order of the input vectors received from the one-bit DACs. That is, block 420 may first be performed for each LSB of the values of the input vector (then, during a next iteration of block 420, the second LSB may be evaluated). Typically, the first bit evaluated would be either the MSB or LSB of the values of the input vector. Vector matrix multiplication may be performed by a circuit similar to embodiment 200 of FIG. 2. It should be understood that other embodiments of analog multiplication circuits are possible. The vector matrix multiplication multiplier may include weighting components that each cause a weighted amount of current indicative of the product of the analog input value and the weighting. Such currents, or some other electrical characteristic, may be output to summation circuitry.

At block 430, for the given bit-order for which vector matrix multiplier performed multiplication functions at block 420, the output of the vector matrix multiplier (which may be in the form of current or voltage) may be stored with a proper bit-order weighting. An indication of the received signal is weighted according to the bit-order of the bits evaluated by the analog vector matrix multiplier and stored. For instance, if evaluation by the analog vector matrix multiplier is performed from LSB to MSB, each subsequent bit may be afforded double the weight when stored by the summation circuit as compared to the previous bit. By way of example only, a sense amplifier may translate the received current from the analog vector matrix multiplier into a voltage. In some examples of a summation circuit, the voltage may be used to charge a particular capacitor having a capacitance corresponding to the bit-order for which block 420 was performed. Therefore, for example, when the LSB is evaluated, the output of the analog matrix multiplier may be used to charge a capacitor having a capacitance of C; when the second LSB is evaluated, the output of the analog matrix multiplier may be used to charge a capacitor having a capacitance of 2C, and so on.

At block 435, if additional bit-orders are yet to be evaluated, method 400 may return to block 410 and be performed for the next bit-order of the input vector. Therefore, each bit-order is evaluated by the analog vector matrix multiplier sequentially and a corresponding output is sequentially stored by the summation circuit with weighting corresponding to its bit-order. If the multiplication operation has been performed on all bit-orders at block 420 and stored at block 430, method 400 can proceed to block 440. Therefore, if each value of an input vector has four bits, blocks 420 and 430 are performed four times: once for each bit of the values.

At block 440, the summation may be determined, such as by performing an accumulation. In some embodiments, the summation is determined in the analog domain. The various bit-order weighted values stored at block 430 may be summed together. By way of example only, if a switch-capacitor array is used, the charge of capacitors may be redistributed among the capacitors, which serves to accumulate the total charge and is bit-weighted by virtue of the capacitance of each capacitor corresponding to a particular bit-order. To do this, a switch may be opened to isolate the switch-capacitor array and all switches directly connected to the capacitors (e.g., 314-1, 314-2, 314-3, and 314-4 of FIG. 3) may be closed. The charge of each capacitor can redistribute among the field of capacitors. The total amount of charge, however, will remain constant and will be properly bit-order weighted due to the difference in capacitance among the capacitors. In other embodiments, rather than using a capacitor array, another form of analog or digital circuit may be used to determine a final summation using the proper bit-orders of each multiplication result.

At block 450, an indication of the summation is output. In some embodiments, the indication of the summation is output as an analog electrical characteristic, such as a voltage magnitude. For example, a voltage at the top plate of a capacitor array as in FIG. 3 can represent the summation of the vector-matrix multiplication. This voltage can be measured and possibly used to determine a numerical value. For example, a separate circuit may use this output voltage, such as an ADC to convert the voltage back to the digital domain.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered.

What is claimed is:

1. A method for performing vector-matrix multiplication, the method comprising:
    converting a digital input vector comprising a plurality of binary-encoded values into a plurality of analog signals using a plurality of one-bit digital to analog converters (DACs);
    sequentially performing, using an analog vector matrix multiplier, a vector-matrix multiplication operation using a weighting matrix for each bit-order of the plurality of analog signals;
    for each sequentially performed vector-matrix multiplication operation, storing a bit-ordered indication of an output of the analog vector matrix multiplier; and
    performing, using a summation circuit, a bit-order weighted summation of the sequentially performed vector-matrix multiplication operation.

2. The method for performing the vector-matrix multiplication of claim 1 wherein a number of clock cycles to sequentially perform the vector-matrix multiplication operation using the weighting matrix for each-bit-order is equal to a number of bit-orders of the binary-encoded values of the input vector.

3. The method for performing the vector-matrix multiplication of claim 1, wherein the bit-ordered weighted summation is performed using an analog circuit.

4. The method for performing the vector-matrix multiplication of claim 3, wherein the bit-ordered weighted summation is performed based on an amount of charge stored by the summation circuit.

5. The method for performing the vector-matrix multiplication of claim 1 wherein the bit-ordered weighted summation is performed in a single clock cycle.

6. The method for performing the vector-matrix multiplication of claim 5 wherein the bit-ordered weighted summation is based on an accumulated total charge stored by the summation circuit.

7. The method for performing the vector-matrix multiplication of claim 1, further comprising:
    outputting a voltage, wherein the magnitude of the voltage is indicative of a summation value.

8. A vector-matrix multiplier circuit, comprising:
    a plurality of digital inputs, wherein each digital input receives a binary-encoded input value of an input vector;
    a plurality of one-bit digital to analog converters (DACs), wherein:
        each one-bit DAC is connected with a corresponding digital input of the plurality of digital inputs; and
        each one-bit DAC outputs a binary-encoded analog signal for the corresponding digital input;
    an analog vector matrix multiplier circuit that performs binary-encoded vector multiplication operations on a single bit-order at a time, wherein the analog vector matrix multiplier circuit receives the binary-encoded analog signal from each one-bit DAC of the plurality of one-bit DACs; and
    a summation circuit that sequentially receives outputs from the analog vector matrix multiplier circuit, weights each received output from the analog vector matrix multiplier circuit according to a bit-order of the output, and sums the weighted received outputs from the analog vector matrix multiplier circuit.

9. The vector-matrix multiplication circuit of claim 8, wherein the analog vector matrix multiplier circuit outputs a plurality of currents indicative of vector multiplication outputs.

10. The vector-matrix multiplication circuit of claim 8, wherein the analog vector matrix multiplier circuit comprises a plurality of weighting components that apply a pre-defined weighting to output from the analog vector matrix multiplier circuit.

11. The vector-matrix multiplication circuit of claim 8, wherein the summation circuit sums the received binary-encoded outputs from the analog vector matrix multiplier circuit using analog componentry.

12. The vector-matrix multiplication circuit of claim 11, wherein the summation circuit comprises a plurality of capacitors arranged in parallel.

13. The vector-matrix multiplication circuit of claim 12, wherein each capacitor of the plurality of capacitors has a capacitance that corresponds to a bit-order weighting.

14. The vector-matrix multiplication circuit of claim 13, wherein the summation circuit comprises a plurality of switches, and each capacitor of the plurality of capacitors receives a voltage based on a binary-encoded output of the analog vector matrix multiplier circuit.

15. The vector-matrix multiplication circuit of claim 14, further comprising switch control logic that determines when each switch of the plurality of switches is open and closed.

16. An apparatus for performing vector-matrix multiplication, the apparatus comprising:
a plurality of one-bit digital to analog converters (DACs) that convert an input vector comprising a plurality of binary-encoded values into a plurality of analog signals;
means for sequentially performing a vector-matrix multiplication operation for each bit-order of the plurality of analog signals;
means for storing a bit-ordered indication of an output of the vector-matrix multiplication operation for each sequentially performed vector-matrix multiplication operation; and
means for performing a bit-order weighted accumulation to produce a summation output indicative a summation of the sequentially performed vector-matrix multiplication operations for each bit-order.

17. The apparatus for performing the vector-matrix multiplication of claim 16 wherein a number of clock cycles to sequentially perform the vector-matrix multiplication operation for each-bit-order is equal to a number of bit-orders of the binary-encoded values of the input vector.

18. The apparatus for performing the vector-matrix multiplication of claim 16, wherein the bit-ordered weighted accumulation is performed using an analog circuit.

19. The apparatus for performing the vector-matrix multiplication of claim 18, wherein the bit-ordered weighted accumulation is performed based on an amount of charge stored by a summation circuit.

20. The apparatus for performing the vector-matrix multiplication of claim 19 wherein the bit-ordered weighted accumulation is performed in a single clock cycle.

* * * * *